United States Patent
Osada

(10) Patent No.: US 7,422,806 B2
(45) Date of Patent: Sep. 9, 2008

(54) SURFACE-COATED CERMET CUTTING TOOL WITH HARD COATING LAYER HAVING EXCELLENT CHIPPING RESISTANCE IN HIGH-SPEED INTERMITTENT CUTTING WORK

(75) Inventor: Akira Osada, Naka-gun (JP)

(73) Assignee: Mitsubishi Materials Corporation, Tokyo (JP)

( * ) Notice: Subject to any disclaimer, the term of this patent is extended or adjusted under 35 U.S.C. 154(b) by 233 days.

(21) Appl. No.: 11/197,949

(22) Filed: Aug. 4, 2005

(65) Prior Publication Data

US 2006/0035111 A1 Feb. 16, 2006

(30) Foreign Application Priority Data

Aug. 11, 2004 (JP) ............... 2004-234560
Jan. 20, 2005 (JP) ............... 2005-012780

(51) Int. Cl.
B32B 9/00 (2006.01)
B23B 27/14 (2006.01)

(52) U.S. Cl. ............ 428/698; 51/307; 51/309; 407/119; 428/212; 428/216; 428/336; 428/701; 428/702

(58) Field of Classification Search ............ 428/212, 428/216, 336, 698, 701, 702; 51/307, 309; 407/119
See application file for complete search history.

(56) References Cited

U.S. PATENT DOCUMENTS 5,786,069 A 7/1998 Ljungberg et al.
5,942,318 A * 8/1999 Soderberg et al. ........ 428/216
6,221,469 B1 4/2001 Ruppi
6,251,508 B1 6/2001 Ruppi
6,293,739 B1 * 9/2001 Uchino et al. ............ 407/119
7,192,660 B2 * 3/2007 Ruppi ..................... 428/698
2001/0006724 A1 7/2001 Holzschuh

FOREIGN PATENT DOCUMENTS

| EP | 0 816 531 A1 | | 1/1998 |
| EP | 0 878 563 A1 | | 11/1998 |
| EP | 1 479 791 A2 | | 11/2004 |
| JP | 05-220604 | * | 8/1993 |
| JP | 06-008010 | * | 1/1994 |
| JP | 06-158325 | * | 6/1994 |
| JP | 07-062542 | * | 3/1995 |
| JP | 10-015710 | * | 1/1998 |

OTHER PUBLICATIONS

Patent Abstracts of Japan for 11-256336 published on Sep. 21, 1999.
Patent Abstracts of Japan for 11-335870 published on Dec. 7, 1999.
Patent Abstracts of Japan for 06-031503 published on Feb. 8, 1994.
European Search Report for EP 05 10 6322 completed Nov. 17, 2005.

* cited by examiner

*Primary Examiner*—Archene Turner
(74) *Attorney, Agent, or Firm*—Darby & Darby P.C.

(57) ABSTRACT

A surface-coated cermet cutting tool with a hard coating layer in a high-speed intermittent cutting work is provided. The hard-coating layer includes lower and upper layers. One of the lower layers is a titanium carbonitride layer, which has the highest peak in $\Sigma 3$ and a distribution ratio of the $\Sigma 3$ to $\Sigma N+1$ ranges 60% to 80% in the atom sharing lattice point distribution graph.

17 Claims, 4 Drawing Sheets

TYPE OF ATOM SHARING LATTICE POINT ( $\Sigma N+1$ )

(a)

(b)

SURFACE-COATED CERMET CUTTING TOOL WITH HARD COATING LAYER HAVING EXCELLENT CHIPPING RESISTANCE IN HIGH-SPEED INTERMITTENT CUTTING WORK

INCORPORATION BY REFERENCE

The present application claims priority under 35 U.S.C. §119 to Japanese Patent Application Nos. 2004-234560 filed on Aug. 11, 2004 and 2005-012780 filed on Jan. 20, 2005. The contents of the applications are incorporated herein by reference in their entireties.

BACKGROUND OF THE INVENTION

1. Field of the Invention

The present invention relates to a surface-coated cermet cutting tool (hereinafter, referred to as a coated cermet tool) of which a hard coating layer exhibits excellent chipping resistance during high-speed intermittent cutting of steel, cast iron, and the like.

2. Description of the Related Art

In recent years, the performance of a cutting tool has been remarkably enhanced, and demands for labor saving and energy saving in cutting work and cost reduction have been increased. Accordingly, the cutting work is more often carried out at a higher speed range. The conventional coated cermet tools generally present no problem when they are used in the continuous cutting or intermittent cutting of steel, cast iron, or the like under normal conditions. Specifically, when the conventional cutting tools are used in a high-speed intermittent cutting under the severest cutting condition, i.e., in the high-speed intermittent cutting in which mechanical impacts are repeatedly applied to the cutting edge at very short pitches, the titanium compound layer which is the lower layer of the hard-coating layer has high-temperature strength and the $Al_2O_3$ layer which is the upper layer of the hard coating layer has high-temperature hardness and excellent heat resistance. However, since the high-temperature strength of the titanium compound layer is not sufficient, it is not possible to satisfactorily cope with the mechanical impacts. As a result, chipping (fine cracks) easily occurs in the hard coating layer, consequently shortening the usable life of the coated cermet tools.

SUMMARY OF THE INVENTION

In view of the above-mentioned problems, paying attention to a TiCN layer constituting the titanium compound layer as a lower layer of the hard coating layer, that is, a TiCN layer which has high-temperature hardness and high-temperature strength greater than those of other layers constituting the titanium compound layer and which has, as shown in FIG. 1 (a), an NaCl type face-centered cubic crystal structure in which constituent atoms including titanium, carbon, and nitrogen exits in lattice points, respectively (FIG. 1 (b) shows a cross section by (011) plane), the inventors have conducted studies for improving the chipping resistance of the hard coating layer of the coated cermet tools and have obtained the following results described below.

(a) The titanium compound layer as the lower layer of the hard coating layer of the conventional coated cermet tools is formed, for example, using a conventional chemical vapor deposition reactor, under the following condition (general condition):

Composition of reaction gas: in volume %, $TiCl_4$: 2 to 10%, $CH_3CN$: 0.5 to 3%, $N_2$: 10 to 30%, and $H_2$: balance, Temperature of reaction atmosphere: 800 to 920° C., and Pressure of reaction atmosphere: 6 to 20 kPa.

However, when the titanium compound layer is formed under conditions:

Composition of reaction gas: in volume %, $TiCl_4$: 0.1 to 0.8%, $CH_3CN$: 0.05 to 0.3%, Ar: 10 to 30%, and $H_2$: balance, Temperature of reaction atmosphere: 930 to 1,000° C., and Pressure of reaction atmosphere: 6 to 20 kPa, that is, a condition (high-temperature condition having the reaction gas composition adjusted) that the concentrations of $TiCl_4$ and $CH_3CN$ are smaller than those of the general condition, Ar gas is added in stead of N2 gas, and the temperature of reaction atmosphere is greater than that of the general condition, a TiCN layer (hereinafter, referred to as "reformed TiCN layer") formed under the high-temperature condition having the reaction gas composition adjusted has more improved high-temperature strength and excellent resistance to mechanical impact. As a result, in the coated cermet tool including the $Al_2O_3$ layer which is the upper layer of the hard coating layer, the titanium compound layer which is the lower layer of the hard coating layer, and one layer of the titanium compound layer composed of the reformed TiCN layer, the hard coating layer exhibits excellent chipping resistance even in the high-speed intermittent cutting work with severe mechanical impacts and the coated cermet tool thus has excellent wear resistance for a long time.

(b) The TiCN layer (hereinafter, referred to as "conventional TiCN layer") constituting the lower layer of the hard coating layer of the conventional coated cermet tool and the reformed TiCN layer described in (a) are treated as follows:

An atom sharing lattice point distribution graph is prepared which shows the distribution ratio at which individual ΣN+1 occupy the total ΣN+1 (where the upper limit is 28 in relation to frequency) when a type of an atom sharing lattice point in which N lattice points (where N is an even number equal to or greater than 2 in an NaCl type face-centered cubic crystal structure) not sharing a constituent atom in the atom sharing lattice points exist is denoted by ΣN+1, by using a field-emission scanning electron microscope, as schematically shown in FIGS. 2A and 2B, to irradiate electron beams to individual crystal particles existing in a measuring range of a surface-polished plane and to measure tilt angles (all the tilt angles of the individual crystal particles including the followings, the tilt angle of (001) plane is 0° and that of (011) plane is 45° shown in FIG. 2A and the tilt angle of (001) plane is 45° and that of (011) plane is 45(shown in FIG. 2B) formed by the normal lines of (001) plane and (100011) plane as a crystal plane of the crystal particles, the crystal particles having an NaCl type face-centered cubic crystal structure in which constituent atoms including titanium, carbon, and nitrogen exist in the lattice points, calculating a distribution of lattice points (atom sharing lattice points) in which each constituent atom is shared with the crystal particles in an interface between adjacent crystal particles on the basis of the measured tilt angles. Then, the highest peak exists in 3 in both TiCN layers. However, the conventional TiCN layer exhibits an atom sharing lattice point distribution graph in which the distribution ratio of 3 is 30% or less as shown in FIG. 4 which is a relatively small distribution ratio, while the reformed TiCN layer exhibits an atom sharing lattice point distribution graph in which the distribution ratio of 3 ranges 60% to 80% as shown in FIG. 3, which is a very great distribution ratio. Here, the very great distribution ratio of 3 is changed in accordance with contents of TiCl4, CH3CN, and Ar constituting the reaction gas and the temperature of the reaction atmosphere.

(c) As described above, the reformed TiCN layer has high-temperature strength greater than that of the conventional TiCN layer, in addition to the high-temperature hardness and the high-temperature strength of TiCN itself. Accordingly, the coated cermet tools in which the reformed TiCN layer is formed as the lower layer of the hard coating layer has a hard coating layer with chipping resistance more excellent than that of the conventional coated cermet tool in which the conventional TiCN layer is formed, even when the cermet tools are used specifically in an intermittent cutting work under a severe cutting condition such as a great cutting depth and a high feed rate, in addition to excellent high-temperature hardness and heat resistance of the Al2O3 layer as the upper layer.

The research results of (a) to (c) described above have been obtained.

The present invention has been reached based on the above-mentioned research results. According to the present invention, there is provided a surface-coated cermet cutting tool with a hard coating layer having excellent chipping resistance in a high-speed intermittent cutting work, the surface-coated cermet cutting tool being formed by coating, on a surface of a tool substrate made of tungsten-carbide-based cemented carbide or titanium-carbonitride-based cermet, the hard-coating layer including the following upper and lower layers (a) and (b):

(a) as the lower layer, a titanium compound layer having at least two layers of a titanium carbide layer, a titanium nitride layer, a titanium carbonitride layer, a titanium carbooxide layer, and a titanium oxycarbonitride layer, all of which are deposited by chemical vapor deposition, the titanium compound layer having a total average layer thickness of 3 to 20 µm, and (b) as the upper layer, an aluminum oxide layer having an average layer thickness of 1 to 15 µm, which is deposited by chemical vapor deposition, wherein one layer of the titanium compound layer as the lower layer (a) comprises a titanium carbonitride layer which has an average layer thickness of 2.5 to 15 µm and which indicates an atom sharing lattice point distribution graph in which the highest peak exists in $\Sigma 3$ and a distribution ratio of the $\Sigma 3$ to $\Sigma N+1$ ranges 60% to 80% in the atom sharing lattice point distribution graph showing the distribution ratio at which individual $\Sigma N+1$ occupy the total $\Sigma N+1$ (where the upper limit is 28 in relation to frequency) when a type of an atom sharing lattice point in which N lattice points (where N is an even number equal to or greater than 2 in an NaCl type face-centered cubic crystal structure) not sharing a constituent atom in the atom sharing lattice points exist is denoted by $\Sigma N+1$, the atom sharing lattice point distribution graph being obtained by using a field-emission scanning electron microscope to irradiate electron beams to individual crystal particles existing in a measuring range of a surface-polished plane and to measure a tilt angle formed by the normal lines of (001) plane and (011) plane as a crystal plane of the crystal particles, the crystal particles having an NaCl type face-centered cubic crystal structure in which constituent atoms including titanium, carbon, and nitrogen exist in the lattice points, calculating a distribution of lattice points (atom sharing lattice points) in which each constituent atom is shared with the crystal particles in an interface between adjacent crystal particles on the basis of the measured tilt angles.

Next, the reason for limiting the numerical values of the layers constituting the hard coating layer of the coated cermet tool according to the present invention described above will be described below.

(a) Titanium Compound Layer (Lower Layer)

A titanium compound layer itself has high-temperature strength and the hard coating layer has high-temperature strength due to the existence of the titanium compound layer. In addition, the titanium compound layer is firmly adhered to both of the tool substrate and the $Al_2O_3$ layer as the upper layer. Accordingly, the titanium compound layer contributes to improvement of adherence of the hard coating layer to the tool substrate. However, when the total average layer thickness is less than 3 µm, the above-mentioned function cannot be sufficiently achieved. On the other hand, when the total average layer thickness is greater than 20 µm, thermal plastic deformation is apt to occur particularly in the high-speed intermittent cutting work accompanying high heat generation, which causes partial wear. Accordingly, the average layer thickness is set to 3 to 20 µm.

(b) Reformed TiCN Layer

In the atom sharing lattice point distribution graph of the reformed TiCN layer, the distribution ratio of 3 can be set to 60% to 80% by adjusting contents of TiCl4, $CH_3CN$, and Ar constituting the reaction gas and the temperature of the reaction atmosphere. In this case, when the distribution ratio of 3 is less than 60%, the hard coating layer cannot have the desired excellent high-temperature strength which causes no chipping in the hard coating layer and the greater distribution ratio of 3 is thus desirable. However, since it is difficult to form the layer with the distribution ratio of 3 greater than 80%, the distribution ratio of 3 is set to 60% to 80%. In this way, the reformed TiCN layer has more excellent high-temperature strength, in addition to the high-temperature hardness and the high-temperature strength of TiCN layer itself as described above. However, when the average layer thickness is less than 2.5 (m, the hard coating layer cannot have the desired excellent high-temperature strength sufficiently improved. On the other hand, when the average layer thickness is greater than 15 (m, the thermal plastic deformation which causes partial wear can be easily generated and the wear is accelerated. As a result, the average layer thickness is set to 2.5 to 15 (m.

(c) $Al_2O_3$ Layer (Upper Layer)

The $Al_2O_3$ layer has excellent high-temperature hardness and heat resistance and contributes to improvement of the wear resistance of the hard coating layer. However, when the average layer thickness is less than 1 µm, the hard coating layer cannot have sufficient wear resistance. On the other hand, when the average layer thickness is greater than 15 µm, chipping is apt to occur. Accordingly, the average layer thickness of the $Al_2O_3$ layer is set to 1 to 15 µm.

Furthermore, for the purpose of identification of the cutting tool before and after use thereof, a TiN layer having golden tone may be formed by deposition as needed. In this case, the average thickness of the TiN layer is preferably 0.1 to 1 µm. This is because, when the average layer thickness thereof is less than 0.1 µm, a sufficient identification effect cannot be achieved, whereas the identification effect due to the TiN layer is sufficient with an average layer thickness up to 1 µm.

The coated cermet tool according to the present invention exhibits excellent wear resistance without generating chipping in the hard coating layer, since the reformed TiCN layer which is one layer of the lower layer of the hard coating layer has excellent high-temperature strength and exhibits excellent chipping resistance even in the high-speed intermittent cutting work of steel or cast iron having very high mechanical and thermal impacts.

DETAILED DESCRIPTION OF THE PREFERRED EMBODIMENTS

Figure 1:
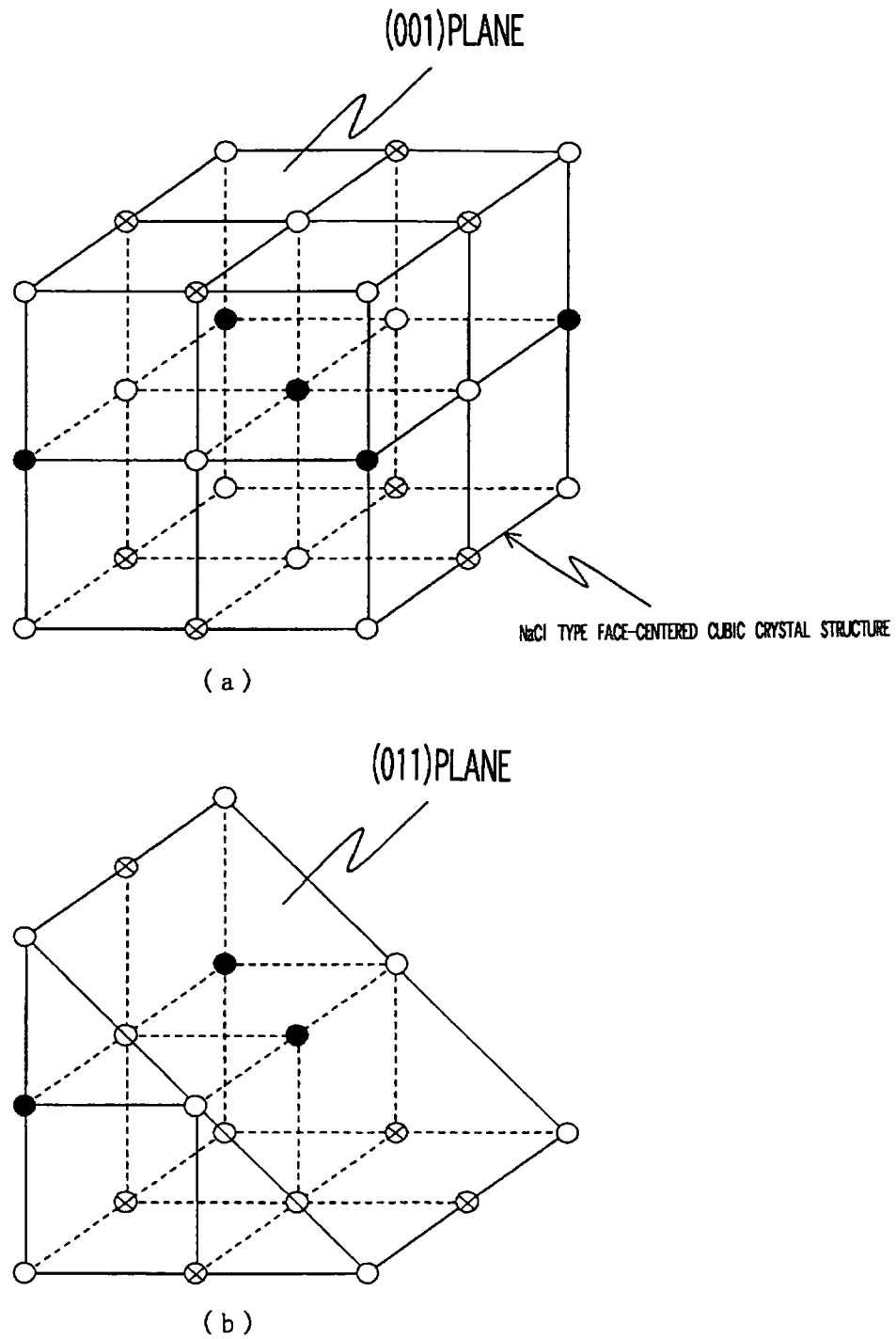
FIGS. 1(a)-1(b) are schematic diagrams illustrating an NaCl type face-centered cubic crystal structure of a TiCN layer constituting a lower layer of a hard coating layer.
Figure 2:
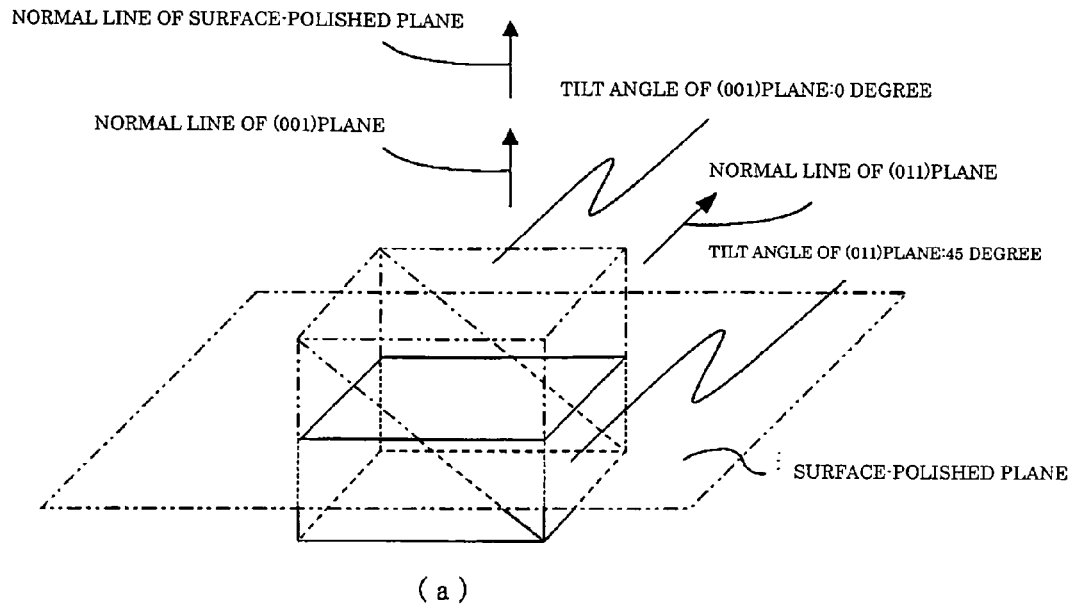
FIGS. 2(a)-2(b) are schematic explanatory diagrams illustrating measurement of a tilt angle in (001) and (011) planes of a crystal particle in the TiCN layer constituting the lower layer of the hard coating layer.
Figure 2:
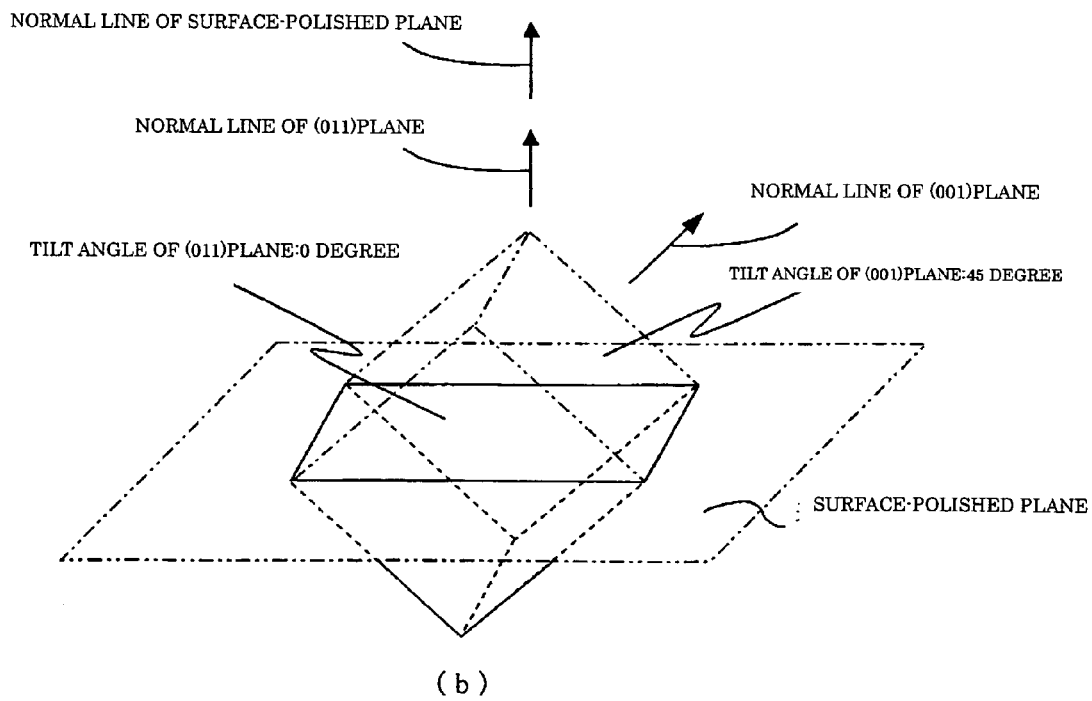

Hereinafter, embodiments of a coated cermet tool according to the present invention will be described in detail.

The following powders, each having a mean particle size in a range of 1 to 3 μm, were prepared as raw materials for substrates: WC powder, TiC powder, ZrC powder, VC powder, TaC powder, NbC powder, $Cr_3C_2$ powder, TiN powder, TaN powder, and Co powder. Those raw powders were compounded with each other based on the compounding compositions shown in Table 1, were mixed with each other in an acetone solution having wax added thereto for 24 hours using a ball mill, and were dried under reduced pressure. Thereafter, the resultant powder mixture was press-formed into a green compact having a predetermined shape at a pressure of 98 Mpa. The green compact was then sintered under the following condition: a vacuum pressure of 5 Pa, a predetermined temperature in a range of 1370 to 1470° C., and a holding duration of 1 hour. After sintering, cutting edges were subjected to horning with a radius of 0.07 mm to manufacture tool substrates A to F made of WC-based cemented carbide and having throwaway tip shapes defined in ISO/CNMG120408.

Further, the following powders, each having a mean particle size in a range of 0.5 to 2 μm, were prepared as raw materials for substrates: TiCN (TiC/TiN=50/50 in weight ratio) powder, $Mo_2C$ power, Zrc power, NbC powder, TaC powder, WC power, Co powder, and Ni powder. Those raw powders were compounded with each other based on the compounding composition shown in Table 2, were wet-mixed with each other for 24 hours using a ball mill, and were dried. Thereafter, the resultant powder mixture was pressed at a pressure of 98 MPa into a green compact. The green compact was then sintered in a nitrogen atmosphere under the following condition: a nitrogen pressure of 1.3 kPa, a temperature of 1540° C., and a holding duration of 1 hour. After sintering, cutting edges were subjected to horning with a radius of 0.07 mm to manufacture tool substrates a to f made of TiCN-based cermet and having tip shapes defined in ISO Standard CNMG120412.

Next, on the surfaces of the tool substrates A to F and the tool substrates a to f, by using a general chemical vapour deposition reactor, a titanium compound layer except for a reformed TiCN layer as a lower layer of a hard coating layer was deposited under conditions shown in Tables 3 and the reformed TiCN layer was deposited with combinations and target layer thicknesses shown in Table 4 under the following condition:

Composition of reaction gas: in volume %, $TiCl_4$: 0.1 to 0.8%, $CH_3CN$: 0.05 to 0.3%, Ar: 10 to 30%, and $H_2$: balance, Temperature of reaction atmosphere: 930 to 1,000° C., and Pressure of reaction atmosphere: 9 kPa.

Next, similarly, an $Al_2O_3$ layer as an upper layer was deposited with combinations and target layer thicknesses shown in Table 4 under the condition shown in Table 3. As a result, the coated cermet tools 1 to 13 according to the present invention were manufactured.

For the purpose of comparison, as shown in Table 6, by using a general chemical vapour deposition reactor, a titanium compound layer except for a conventional TiCN layer as a lower layer of a hard coating layer was deposited under conditions shown in Tables 3 and the conventional TiCN layer was deposited with combinations and target layer thicknesses shown in Table 5 under the following condition:

Composition of reaction gas: in volume %, $TiCl_4$: 2 to 10%, $CH_3CN$: 0.5 to 3%, $N_2$: 10 to 30%, and $H_2$: balance, Temperature of reaction atmosphere: 800 to 900° C., and Pressure of reaction atmosphere: 9 kPa.

Next, similarly, an $Al_2O_3$ layer as an upper layer was deposited with combinations and target layer thicknesses shown in Table 5 under the conditions shown in Table 3. As a result, the conventional coated cermet tools 1 to 13 were manufactured.

Atom sharing lattice point distribution graphs were prepared for the reformed TiCN layers and the conventional TiCN layers constituting the hard coating layers of the coated cermet tools according to the present invention and the conventional coated cermet tools, respectively, by using a field-emission scanning electron microscope.

That is, in a state where the surfaces of the reformed TiCN layers and the conventional TiCN layers were set as surface-polished planes, the coated cermet tools were set inside a lens barrel of the field-emission scanning electron microscope, electron beams with an acceleration voltage of 15 kV and an incidence angle of 70° about the surface-polished plane were irradiated onto individual crystal particles existing in a measurement range of the surface-polished plane with an irradiation current of 1 nA, tilt angles formed by the normal lines of the surface-polished plane and the normal lines of (001) and (011) planes which are crystal planes of the crystal particles were measured at intervals of 0.1 μm/step in an area of 30×50 μm by using an electron backscattering diffraction patterning apparatus, a distribution of lattice points (atom sharing lattice points) in which each constituent atom is shared with the crystal particles in an interface between adjacent crystal particles is calculated on the basis of the measured tilt angles, the distribution ratio at which individual ΣN+1 occupy the total ΣN+1 (where the upper limit is 28 in relation to frequency) when a type of an atom sharing lattice point in which N lattice points (where N is an even number equal to or greater than 2 in an NaCl type face-centered cubic crystal structure) not sharing a constituent atom in the atom sharing lattice points exist is denoted by ΣN+1, whereby the atom sharing lattice point distribution graphs were prepared.

In the atom sharing lattice point distribution graphs of the reformed TiCN layers and the conventional TiCN layers obtained as the above-mentioned preparation, the ratios of 3 to the total ΣN+1 (where N includes all the even numbers in the range of 2 to 28) were shown in Tables 4 and 5.

In the atom sharing lattice point distribution graphs, as shown in Tables 4 and 5, all the reformed TiCN layers of the coated cermet tools according to the present invention exhibited the atom sharing lattice point distribution graphs in which the distribution ratio of Σ3 ranges 60% to 80%, while all the conventional TiCN layers of the conventional coated cermet tools exhibited the atom sharing lattice point distribution graphs in which the distribution ratio of Σ3 is less than 30%.

Figure 3:
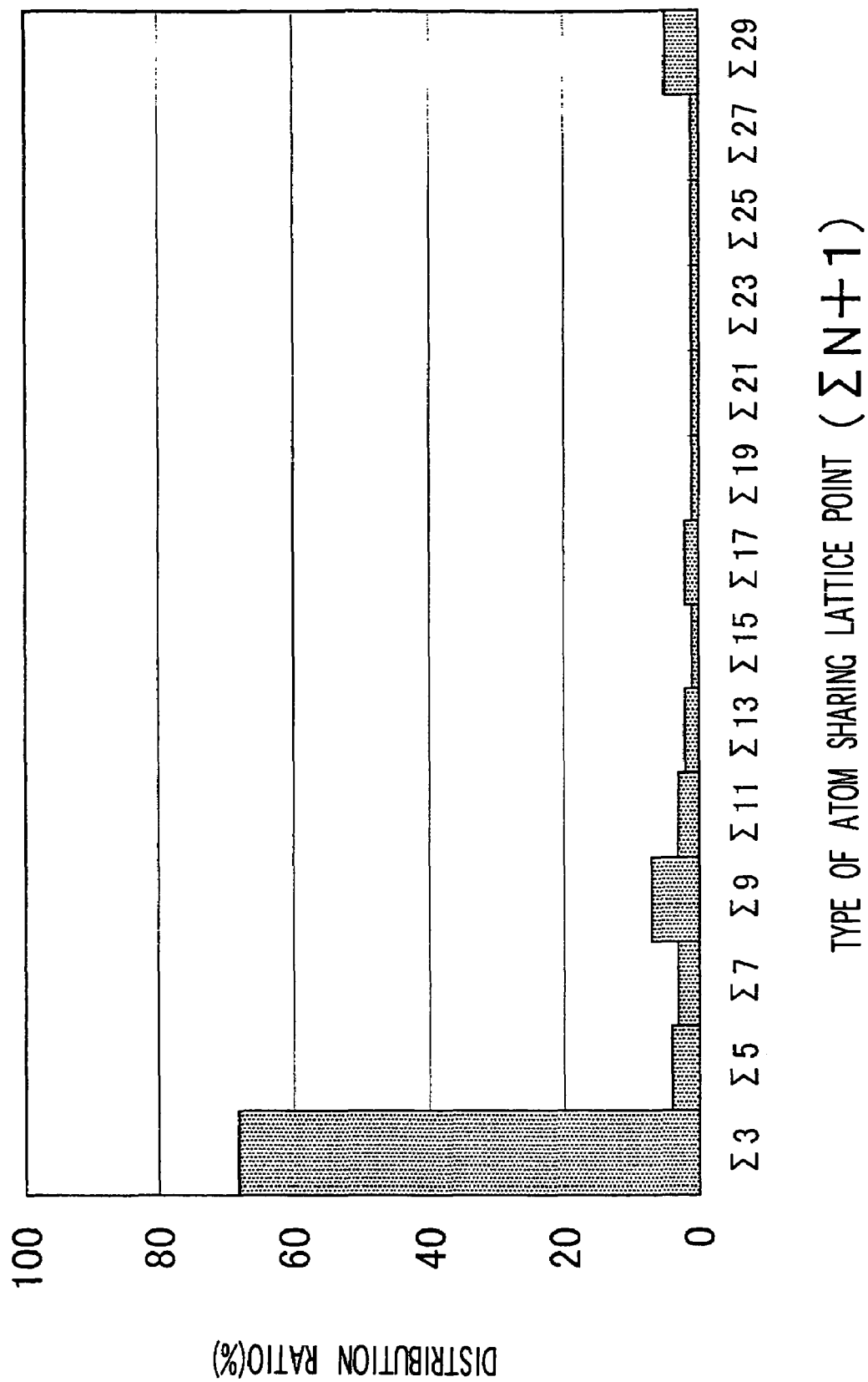
FIG. 3 is an atom sharing lattice point distribution graph of the reformed TiCN layer constituting the lower layer of the hard coating layer of the coated cermet tool 11 according to the present invention.
Figure 4:
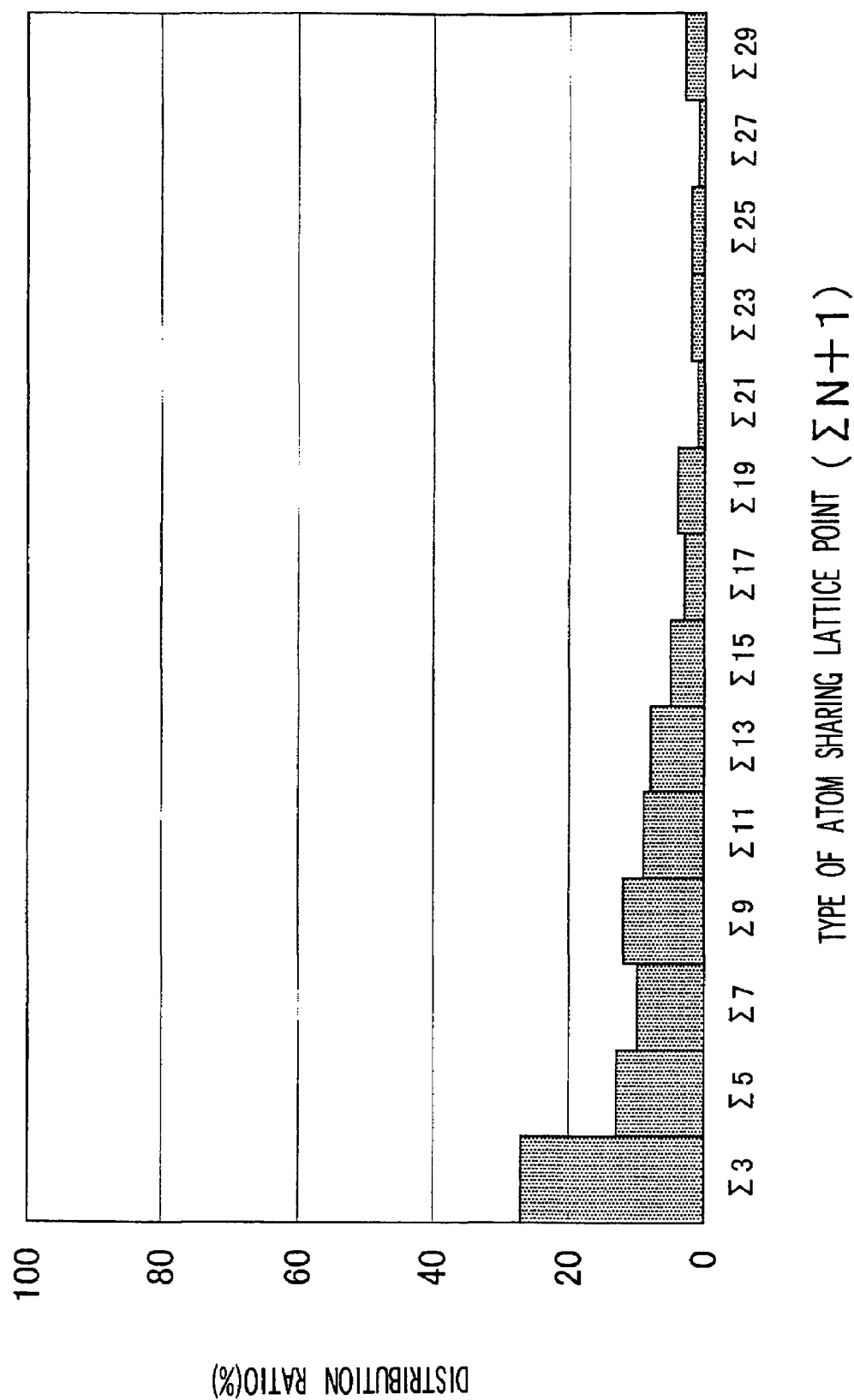
FIG. 4 is an atom sharing lattice point distribution graph of a conventional TiCN layer constituting the lower layer of the hard coating layer of a conventional coated cermet tool 11.

FIG. 3 shows an atom sharing lattice point distribution graph of the reformed TiCN layer of the coated cermet tool 11 according to the present invention and FIG. 4 shows an atom sharing lattice point distribution graph of the conventional TiCN layer of the conventional coated cermet tool 11.

Furthermore, in the coated cermet tools 1 to 13 according to the present invention and the conventional coated cermet tools 1 to 13, the layers constituting the hard coating layers thereof were observed (the longitudinal sections of the layers were observed) by using an electron probe micro-analyzer (EPMA) and an Auger spectroscopy analyzer. It was confirmed that the former and the latter include the titanium compound layers and the $Al_2O_3$ layers having substantially the same compositions as the target composition. Moreover, when the thicknesses of the layers constituting the hard coating layers of the coated cermet tools were measured using a scanning electron microscope (similarly, longitudinal sections of the layers were measured), all the layers had substantially the same average layer thicknesses (average values of five point measurement) as the target layer thickness.

Next, in a state in which each of the above-mentioned coated cermet tools was screw-fixed to a tip of a bite made of tool steel with a fixing jig, the coated cermet tools 1 to 13 according to the present invention and the conventional coated cermet tools 1 to 13 were subjected to the following tests:

A dry high-speed intermittent cutting test of alloyed steel (normal cutting speed is 200 m/min) under the following condition (Cutting condition A):
  Workpiece: a JIS/S40C round bar having four longitudinal grooves equidistantly arranged in the longitudinal direction,
  Cutting speed: 400 m/min,
  Depth of cut: 1.5 mm,
  Feed rate: 0.20 mm/rev,
  Cutting time: 10 min;

A dry high-speed intermittent cutting test of dark-tiled cast iron (normal cutting speed is 200 m/min) under the following condition (Cutting condition B):
  Workpiece: a JIS/FCD450 round bar having four longitudinal grooves equidistantly arranged in the longitudinal direction,
  Cutting speed: 400 m/min,
  Depth of cut: 2.0 mm,
  Feed rate: 0.32 mm/rev,
  Cutting time: 10 min; and A dry high-speed intermittent cutting test of alloyed steel (normal cutting speed is 200 m/min) under the following condition (Cutting condition C):
  Workpiece: a JIS/SCr420H round bar having four longitudinal grooves equidistantly arranged in the longitudinal direction,
  Cutting speed: 400 m/min,
  Depth of cut: 1.5 mm,
  Feed rate: 0.24 mm/rev,
  Cutting time: 10 min, Then, the width of flank wear of a cutting edge was measured in each test. The measurement results are shown in Table 6.

TABLE 1

| | | Compounding Composition (mass %) | | | | | | | | |
|---|---|---|---|---|---|---|---|---|---|---|
| Type | | Co | TiC | ZrC | VC | TaC | NbC | $Cr_3C_2$ | TiN | TaN | WC |
| Tool | A | 7 | — | 2 | — | — | 3 | — | 2 | — | Balance |
| Substrate | B | 5.7 | — | — | — | 1.5 | 0.5 | — | — | — | Balance |
| | C | 5.7 | — | — | — | — | — | 1 | — | — | Balance |
| | D | 8.5 | — | 0.5 | — | — | — | 0.5 | — | — | Balance |
| | E | 12.5 | 2 | — | — | — | — | — | 1 | 2 | Balance |
| | F | 10 | — | — | 0.2 | — | — | 0.8 | — | — | Balance |

TABLE 2

| | | Compounding Composition (mass %) | | | | | | | |
|---|---|---|---|---|---|---|---|---|---|
| Type | | Co | Ni | ZrC | TaC | NbC | $Mo_2C$ | WC | TiCN |
| Tool | a | 13 | 5 | — | 10 | — | 10 | 16 | Balance |
| Sub- | b | 8 | 7 | — | 5 | — | 7.5 | — | Balance |
| strate | c | 5 | — | — | — | — | 6 | 10 | Balance |
| | d | 10 | 5 | — | 11 | 2 | — | — | Balance |
| | e | 9 | 4 | 1 | 8 | — | 10 | 10 | Balance |
| | f | 12 | 5.5 | — | 10 | — | 9.5 | 14.5 | Balance |

TABLE 3

| Layer Constituting Hard-coating layer Type | Formation Condition (Pressure of Reaction Atmosphere denotes kPa, and temperature thereof denotes ° C.) | | |
|---|---|---|---|
| | Reaction Gas Composition (volume %) | Reaction Atmosphere Pressure | Temperature |
| TiC | $TiCl_4$: 4.2%, $CH_4$: 8.5%, $H_2$: Balance | 7 | 1020 |
| TiN (First Layer) | $TiCl_4$: 4.2%, $N_2$: 30%, $H_2$: Balance | 30 | 900 |
| TiN (Other Layers) | $TiCl_4$: 4.2%, $N_2$: 35%, $H_2$: Balance | 50 | 1040 |
| TiCO | $TiCl_4$: 4.2%, CO: 4%, $H_2$: Balance | 7 | 1020 |
| TiCNO | $TiCl_4$: 4.2%, CO: 3%, $CH_4$: 3%, $N_2$: 20%, $H_2$: Balance | 20 | 1020 |
| $Al_2O_3$ | $AlCl_3$: 2.2%, $CO_2$: 5.5%, HCl: 2.2%, $H_2S$: 0.2%, $H_2$: Balance | 7 | 1000 |

TABLE 4

| Type | | Tool Substrate Symbol | Hard-coating layer (numerals in parentheses denotes target thickness: μm) ||||||
|---|---|---|---|---|---|---|---|---|
| | | | Lower layer (Ti compound layer) ||||| Upper layer |
| | | | First Layer | Second Layer | Third Layer | Fourth Layer | ✗ Distribution ratio of Σ3 in TiCN layer (%) | Target layer thickness of $Al_2O_3$ layer (μm) |
| Coated Cermet Tool of the Present Invention | 1 | A | TiN (1) | ✗TiCN (7.5) | TiN (1) | TiCNO (0.5) | 75 | 7 |
| | 2 | B | TiN (1) | ✗TiCN (15) | TiC (3) | TiCNO (1) | 63 | 1 |
| | 3 | C | TiCN (1) | ✗TiCN (5) | TiCO (0.5) | — | 62 | 10 |
| | 4 | D | TiC (1) | ✗TiCN (10) | — | — | 80 | 8 |
| | 5 | E | TiN (1) | ✗TiCN (5) | TiCO (0.5) | — | 78 | 10 |
| | 6 | F | TiN (0.5) | ✗TiCN (2.5) | TiC (0.5) | TiCNO (0.5) | 65 | 12 |
| | 7 | A | TiN (1) | ✗TiCN (12.5) | TiCNO (0.5) | — | 70 | 2 |
| | 8 | a | TiN (1) | ✗TiCN (10) | TiCN (3) | — | 73 | 6 |
| | 9 | b | TiC (0.5) | ✗TiCN (15) | TiCO (0.5) | — | 66 | 3 |
| | 10 | c | TiN (1) | TiC (1) | ✗TiCN (7.5) | TiCO (1) | 71 | 11 |
| | 11 | c | TiN (1) | TIC (1) | ✗TiCN (5) | — | 68 | 9 |
| | 12 | d | TiC (0.1) | ✗TiCN (2.5) | TiCNO (0.4) | — | 60 | 15 |
| | 13 | f | TiCN (0.5) | ✗TiCN (12.5) | TiCNO (0.5) | — | 77 | 4 |

(In Table 4, symbol "✗" indicates the reformed TiCN layer.)

TABLE 5

| Type | | Tool Substrate Symbol | Hard-coating layer (numerals in parentheses denotes target thickness: μm) ||||||
|---|---|---|---|---|---|---|---|---|
| | | | Lower layer (Ti compound layer) ||||| |
| | | | First Layer | Second Layer | Third Layer | Fourth Layer | ✗ Distribution ratio of Σ3 in TiCN layer (%) | Upper layer Target layer thickness of $Al_2O_3$ layer (μm) |
| Conventional Coated Cermet Tool | 1 | A | TiN (1) | TiCN (7.5) | TiN (1) | TiCNO (0.5) | 23 | 7 |
| | 2 | B | TiN (1) | TiCN (15) | TiC (3) | TiCNO (1) | 25 | 1 |
| | 3 | C | TiCN (1) | TiCN (5) | TiCO (0.5) | — | 22 | 13 |
| | 4 | D | TiC (1) | TiCN (10) | — | — | 30 | 8 |
| | 5 | E | TiN (1) | TiCN (5) | TiCO (0.5) | — | 24 | 10 |
| | 6 | F | TiN (0.5) | TiCN (2.5) | TiC (0.5) | TiCNO (0.5) | 21 | 12 |
| | 7 | A | TiN (1) | TiCN (12.5) | TiCNO (0.5) | — | 22 | 2 |
| | 8 | a | TiN (1) | TiCN (10) | — | — | 25 | 6 |
| | 9 | b | TiC (0.5) | TiCN (15) | TiCO (0.5) | — | 24 | 3 |
| | 10 | c | TiN (1) | TiC (1) | TiCN (7.5) | TiCO (1) | 26 | 11 |
| | 11 | c | TiN (1) | TIC (1) | TiCN (5) | — | 27 | 9 |
| | 12 | d | TiC (0.1) | TiCN (2.5) | TiCNO (0.4) | — | 20 | 15 |

TABLE 5-continued

| | | | Hard-coating layer (numerals in parentheses denotes target thickness: μm) | | | | | |
|---|---|---|---|---|---|---|---|---|
| | | | Lower layer (Ti compound layer) | | | | | |
| Type | | Tool Substrate Symbol | First Layer | Second Layer | Third Layer | Fourth Layer | ✗ Distribution ratio of Σ3 in TiCN layer (%) | Upper layer Target layer thickness of Al₂O₃ layer (μm) |
| | 13 | f | TiCN (0.5) | TiCN (12.5) | TiCNO (0.5) | — | 28 | 4 |

(In Table 5, symbol "✗" indicates the reformed TiCN layer.)

TABLE 6

| | | Width of Flank Wear (mm) | | | | | Cutting Test Result | | |
|---|---|---|---|---|---|---|---|---|---|
| Type | | Cutting condition A | Cutting condition B | Cutting condition C | Type | | Cutting condition A | Cutting condition B | Cutting condition C |
| Cermet Tool of the Present | 1 | 0.22 | 0.24 | 0.23 | Conventional Coated Cermet Tool | 1 | Usable life of 2.5 min. | Usable life of 2.7 min. | Usable life of 2.6 min. |
| | 2 | 0.33 | 0.32 | 0.36 | | 2 | Usable life of 0.4 min. | Usable life of 1.0 min. | Usable life of 0.3 min. |
| | 3 | 0.30 | 0.28 | 0.32 | | 3 | Usable life of 2.0 min. | Usable life of 2.5 min. | Usable life of 2.3 min. |
| | 4 | 0.18 | 0.20 | 0.19 | | 4 | Usable life of 2.3 min. | Usable life of 2.4 min. | Usable life of 2.6 min. |
| | 5 | 0.21 | 0.20 | 0.21 | | 5 | Usable life of 2.8 min. | Usable life of 2.9 min. | Usable life of 3.0 min. |
| | 6 | 0.32 | 0.31 | 0.30 | | 6 | Usable life of 0.8 min. | Usable life of 0.5 min. | Usable life of 0.9 min. |
| | 7 | 0.26 | 0.27 | 0.26 | | 7 | Usable life of 1.4 min. | Usable life of 1.6 min. | Usable life of 1.0 min. |
| | 8 | 0.25 | 0.26 | 0.24 | | 8 | Usable life of 1.9 min. | Usable life of 2.1 min. | Usable life of 1.4 min. |
| | 9 | 0.29 | 0.29 | 0.27 | | 9 | Usable life of 0.2 min. | Usable life of 1.3 min. | Usable life of 0.5 min. |
| | 10 | 0.24 | 0.23 | 0.22 | | 10 | Usable life of 3.0 min. | Usable life of 2.9 min. | Usable life of 3.3 min. |
| | 11 | 0.28 | 0.27 | 0.29 | | 11 | Usable life of 2.2 min. | Usable life of 3.2 min. | Usable life of 2.0 min. |
| | 12 | 0.25 | 0.34 | 0.34 | | 12 | Usable life of 0.7 min. | Usable life of 0.9 min. | Usable life of 0.6 min. |
| | 13 | 0.20 | 0.21 | 0.19 | | 13 | Usable life of 1.0 min. | Usable life of 1.8 min. | Usable life of 1.7 min. |

(In Table 6, usable life is caused by chipping generated in the hard coating layer.)

As can be apparently seen from Tables 4 to 6, in the coated cermet tools 1 to 13 according to the present invention in which one layer in the lower layer of the hard coating layer is composed of the reformed TiCN layer indicating the atom sharing lattice point distribution graph in which the distribution ratio of Σ3 ranges 60% to 80%, since the reformed TiCN layer has excellent high-temperature strength and excellent chipping resistance even in the high-speed intermittent cutting of steel or cast iron having very great mechanical impacts, the generation of chipping in the hard coating layer is suppressed remarkably and the excellent wear resistance is exhibited. On the contrary, in the conventional cermet tools 1 to 13 in which one layer in the lower layer of the hard coating layer is composed of the conventional TiCN layer exhibiting the atom sharing lattice point distribution graph in which the distribution ratio of Σ3 is 30% or less, since the hard coating layer does not have sufficient resistance to mechanical impacts in the high-speed intermittent cutting, chipping occurs in the hard coating layer, thereby shortening the usable life thereof.

As described above, the coated cermet tools according to the present invention have the hard coating layer exhibiting excellent chipping resistance not only in the continuous cutting or intermittent cutting of various materials such as steel and cast iron under normal conditions but also in the high-speed intermittent cutting under the severest cutting conditions accompanying very high-temperature strength and exhibit excellent cutting performance for a prolonged period of time. Accordingly, it is possible to sufficiently and satisfactorily cope with the demand for high performance of a cutting device, labor saving and energy saving in a cutting work, and cost reduction.

What is claimed is:

1. A surface-coated cermet cutting tool with a hard coating layer for a high-speed intermittent cutting work, comprising:

a tool substrate made of tungsten-carbide cemented carbide or titanium-carbonitride-cermet, the substrate being coated with the hard-coating layer including lower and upper layers:

the lower layer comprising titanium compound layers having at least any two layers selected from the group consisting of a titanium carbide layer, a titanium nitride layer, a titanium carbonitride layer, a titanium carbooxide layer, and a titanium oxycarbonitride layer, the titanium compound layer having a total average layer thickness of 3 to 20 μm, and the upper layer comprising an aluminum oxide layer having an average layer thickness of 1 to 15 μm, wherein one layer of the titanium compound layers as the lower layer comprises a titanium carbonitride layer which has an average layer thickness of 2.5 to 15 μm and has the highest peak in $\Sigma 3$ and a distribution ratio of the $\Sigma 3$ to $\Sigma N+1$ ranges 60% to 80% in an atom sharing lattice point distribution graph showing the distribution ratio at which individual $\Sigma N+1$ occupy the total $\Sigma N+1$ (where the upper limit of N is 28 in relation to frequency) when a type of an atom sharing lattice point in which N lattice points (where N is an even number equal to or greater than 2 in an NaCl type face-centered cubic crystal structure) not sharing a constituent atom between the atom sharing lattice points exist is denoted by $\Sigma N+1$, the atom sharing lattice point distribution graph being obtained by using a field-emission scanning electron microscope to irradiate electron beams to individual crystal particles existing in a measuring range of a surface-polished plane and to measure a tilt angle formed by the normal lines of (001) plane and (011) plane as a crystal plane of the crystal particles, the crystal particles having an NaCl type face-centered cubic crystal structure in which constituent atoms including titanium, carbon, and nitrogen exist in the lattice points, calculating a distribution of lattice points (atom sharing lattice points) in which each constituent atom is shared with the crystal particles in an interface between adjacent crystal particles on the basis of the measured tilt angles.

2. A surface-coated cermet cutting tool for a high-speed intermittent cutting work, comprising:

a tool substrate being coated with a hard-coating layer that has lower and upper layers:

the lower layer comprising titanium compound layers; and the upper layer comprising an aluminum oxide layer, wherein one the titanium compound layers comprises a titanium carbonitride layer and has the highest peak in $\Sigma 3$ and a distribution ratio of the $\Sigma 3$ to $\Sigma N+1$ ranges 60% to 80% in an atom sharing lattice point distribution graph, which shows the distribution ratio at which individual $\Sigma N+1$ occupy the total $\Sigma N+1$ (where the upper limit of N is 28 in relation to frequency) when a type of an atom sharing lattice point in which N lattice points (where N is an even number equal to or greater than 2 in an NaCl type face-centered cubic crystal structure) not sharing a constituent atom between the atom sharing lattice points exist is denoted by $\Sigma N+1$, the atom sharing lattice point distribution graph is obtained by using a field-emission scanning electron microscope to irradiate electron beams to individual crystal particles existing in a measuring range of a surface-polished plane and to measure a tilt angle formed by the normal lines of {001} plane and {011} plane as a crystal plane of the crystal particles.

3. A surface-coated cermet cutting tool according to claim 2, wherein the tool substrate is made of tungsten-carbide cemented carbide or titanium-carbonitride based cermet.

4. A surface-coated cermet cutting tool according to claim 2, wherein the titanium compound layers have at least any two layers selected from the group consisting of a titanium carbide layer, a titanium nitride layer, a titanium carbonitride layer, a titanium carbooxide layer, and a titanium oxycarbonitride layer.

5. A surface-coated cermet cutting tool according to claim 2, wherein the titanium compound layers have a total average layer thickness of 3 to 20 μm.

6. A surface-coated cermet cutting tool according to claim 2, wherein the aluminum oxide layer has an average layer thickness of 1 to 15 μm.

7. A surface-coated cermet cutting tool according to claim 2, wherein the titanium carbonitride layer has an average layer thickness of 2.5 to 15 μm.

8. A surface-coated cermet cutting tool according to claim 2, wherein the crystal particles have an NaCl type face-centered cubic crystal structure in which constituent atoms including titanium, carbon, and nitrogen exist in the lattice points.

9. A surface-coating cermet cutting tool according to claim 8, wherein the lattice point distribution graph is obtained by further calculating a distribution of lattice points (atom sharing lattice points) in which each constituent atom is shared with the crystal particles in an interface between adjacent crystal particles on the basis of the measured tilt angles.

10. A surface-coated cermet cutting tool for a high-speed intermittent cutting work, comprising:

a tool substrate being coated with a hard-coating layer that has lower and upper layers:

the lower layer comprising titanium compound layers; and the upper layer comprising an aluminum oxide layer, wherein one the titanium compound layers comprises a titanium carbonitride layer and has the highest peak in $\Sigma 3$ and a distribution ratio of the $\Sigma 3$ to $\Sigma N+1$ ranges 60% to 80% in an atom sharing lattice point distribution graph, which shows the distribution ratio at which individual $\Sigma N+1$ occupy the total $\Sigma N+1$ (where the upper limit of N is 28 in relation to frequency) when a type of an atom sharing lattice point in which N lattice points (where N is an even number equal to or greater than 2 in an NaCl type face-centered cubic crystal structure) not sharing a constituent atom between the atom sharing lattice points exist is denoted by $\tau N+1$.

11. A surface-coated cermet cutting tool according to claim 10, wherein the tool substrate is made of tungsten-carbide cemented carbide or titanium-carbonitride cermet.

12. A surface-coated cermet cutting tool according to claim 10, wherein the titanium compound layers have at least any two layers selected from the group consisting of a titanium carbide layer, a titanium nitride layer, a titanium carbonitride layer, a titanium carbooxide layer, and a titanium oxycarbonitride layer.

13. A surface-coated cermet cutting tool according to claim 10, wherein the titanium compound layers have a total average layer thickness of 3 to 20 μm.

14. A surface-coated cermet cutting tool according to claim 10, wherein the aluminum oxide layer has an average layer thickness of 1 to 15 μm.

15. A surface-coated cermet cutting tool according to claim 10, wherein the titanium carbonitride layer has an average layer thickness of 2.5 to 15 μm.

16. A surface-coated cermet cutting tool according to claim 10, wherein the atom sharing lattice point distribution graph is obtained by using a field-emission scanning electron microscope to irradiate electron beams to individual crystal particles existing in a measuring range of a surface-polished plane and to measure a tilt angle formed by the normal lines of {001} plane and {011} plane as a crystal plane of the crystal particles, the crystal particles have an NaCl type face-centered cubic crystal structure in which constituent atoms including titanium, carbon, and nitrogen exist in the lattice points.

17. A surface-coating cermet cutting tool according to claim 16, wherein the lattice point distribution graph is obtained by further calculating a distribution of lattice points (atom sharing lattice points) in which each constituent atom is shared with the crystal particles in an interface between adjacent crystal particles on the basis of the measured tilt angles.

* * * * *